(12) United States Patent
Mondello et al.

(10) Patent No.: US 7,567,470 B2
(45) Date of Patent: Jul. 28, 2009

(54) AUTOMATIC REGULATION METHOD FOR THE REFERENCE SOURCES IN A NON-VOLATILE MEMORY DEVICE AND CORRESPONDING MEMORY DEVICE

(76) Inventors: Antonino Mondello, Via Comunale Santo, 370/A, Messina (IT) 98148; Michelangelo Pisasale, Via Orto Limoni, 6, Catania (IT) 95125

( * ) Notice: Subject to any disclaimer, the term of this patent is extended or adjusted under 35 U.S.C. 154(b) by 102 days.

(21) Appl. No.: 11/771,677

(22) Filed: Jun. 29, 2007

(65) Prior Publication Data

US 2008/0013387 A1    Jan. 17, 2008

(30) Foreign Application Priority Data

Jun. 30, 2006   (EP) .................................. 06425452

(51) Int. Cl.
*G11C 5/14* (2006.01)
(52) U.S. Cl. ............................. 365/189.09; 365/189.03; 365/189.06; 365/189.07; 365/191; 365/185.09
(58) Field of Classification Search ............ 365/189.09, 365/189.03, 189.06, 189.07, 191, 185.09
See application file for complete search history.

(56) References Cited

U.S. PATENT DOCUMENTS

| | | | |
|---|---|---|---|
| 6,826,092 B2 * | 11/2004 | Ho et al. ................ | 365/189.05 |
| 7,046,097 B2 * | 5/2006 | Kappes et al. ............... | 331/135 |
| 2002/0153917 A1 | 10/2002 | Tanaka et al. ............... | 324/765 |
| 2004/0042331 A1 | 3/2004 | Ikehashi et al. ............. | 365/232 |
| 2004/0095810 A1 | 5/2004 | Cioaca et al. ........... | 365/189.09 |
| 2004/0179417 A1 * | 9/2004 | Lehmann et al. ............ | 365/226 |
| 2006/0239063 A1 * | 10/2006 | Matsumoto et al. ......... | 365/154 |

* cited by examiner

*Primary Examiner*—Pho M. Luu
*Assistant Examiner*—Thao Bui
(74) *Attorney, Agent, or Firm*—Trop, Pruner & Hu, P.C.

(57) ABSTRACT

A method and a relative automatic regulation device regulate the reference sources in a non-volatile memory device, for example a flash memory. The method includes the following steps: providing, in the memory device, a regulation device of the reference sources and at least one start command for the entry in regulation mode; providing, on the device, at least one command for the selection of a corresponding reference source to be regulated; applying an external reference signal; starting the automatic regulation step by means of said command; detecting the result of the regulation step by means of a logic output of the memory device; if the result of the regulation of a given source is positive, proceeding, by means of the same process steps, with the regulation of another source.

4 Claims, 5 Drawing Sheets

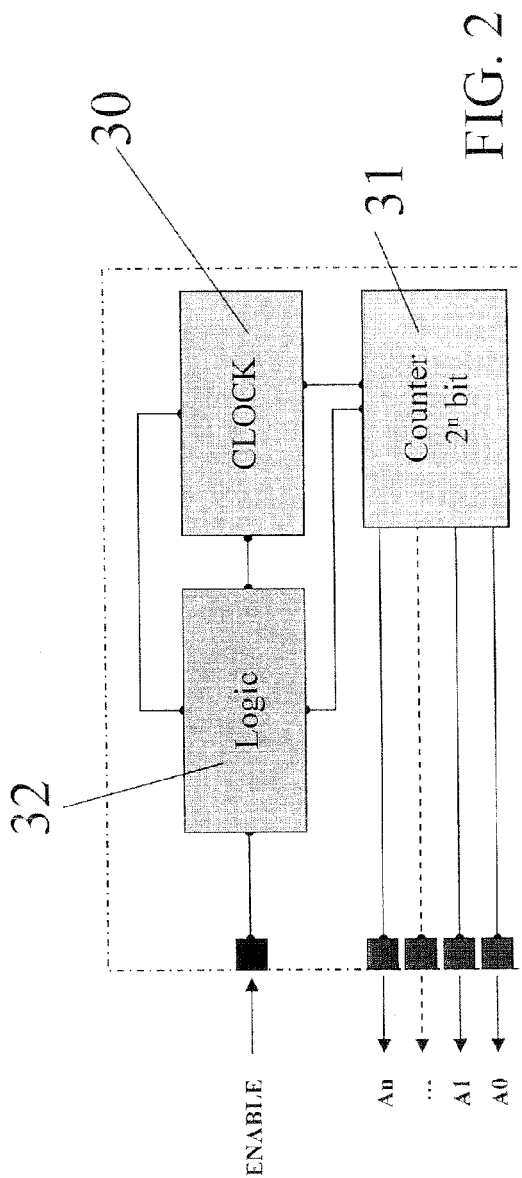
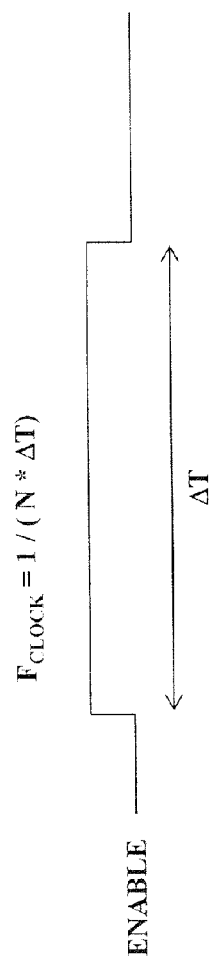
FIG. 2
$F_{CLOCK} = 1/(N * \Delta T)$
FIG. 2A
Prior Art

AUTOMATIC REGULATION METHOD FOR THE REFERENCE SOURCES IN A NON-VOLATILE MEMORY DEVICE AND CORRESPONDING MEMORY DEVICE

BACKGROUND

1. Technical Field

The present invention relates to a method for the automatic regulation of the reference sources in a non-volatile memory device, for example a flash memory. More specifically, one embodiment of the invention relates to a method for the automatic regulation of the reference sources in a non-volatile memory device incorporating a plurality of sources or signal generators or reference potentials and for which a functionality testing step is provided at the end of the production process by means of a test machine removably connected to some terminals of the device. One embodiment of the invention particularly, but not exclusively, relates to a non-volatile memory device of the Flash EEPROM type and the following description is made with reference to this specific field of application for simplifying the illustration only.

2. Description of the Related Art

As is well known in this specific technical field, for the correct operation of a flash memory, different signals may serve as references for most of the inner circuitry. In particular, sample signals may represent a constant reference in voltage or in current, or variable signals having square wave but fixed frequency.

All these signals are produced inside by using different circuit techniques for their generation, for example the use of sources based on the energy gap between the conduction and valence band of the silicon is known to obtain stable signals in voltage, this category of circuits are called band gaps and provide excellent performances to supply stable references in voltage. The stability is ensured both when the temperature varies and when the supply voltage varies.

Similar solutions are adopted for producing reference currents. Often, these sources are in turn used for producing signals serving as a base for the clock times of different inner circuits (for example clocks for charge pumps, clocks for the embedded micro-controller etc . . . ).

Unfortunately, to obtain stable reference signals the sole, correct design of the references is not enough since some inevitable layout asymmetries of the structures constituting them, as well as variations of the technological processes, invalidate their precision. For these reasons, before starting the flash memory test operations, it may be prudent to suitably regulate all the generators of the inner references by acting on suitable configuration registers inside the memory.

At present, the regulation of the reference sources is carried out at the end of the manufacturing process of the memory integrated circuit and by means of the intervention of a test machine on the memory. More in particular, the value of a signal S to be regulated by means of a suitable procedure is read. The test machine processes the measurement and determines the correction to be carried out. The correction is then set in the memory configuration registers.

This solution is schematized in the herewith annexed FIG. 1 wherein the temporary coupling is shown between a test machine and a generic memory device to be tested, shown as DUT (Device Under Test).

At this point, the reading of the regulated width is repeated for establishing if the measured value is acceptable, i.e., if:

$$\left| S_\Delta^{et} S_{toll} \right|_{\leq}^{t\ measured}_{arg}$$

is equal to that provided when designing apart from a predetermined tolerance $\Delta_{toll}$. In case the regulation has not succeeded the process is repeated for a predetermined number of times, afterwards the device is discarded.

As regards instead the measuring and the regulation of a clock source, in the prior art there already exists a solution shown by way of example in FIG. 2.

In this solution a clock circuit 30, which is to be measured, is enabled by means of a counter 31, under the supervision of a logic 32. The counter 31 which takes care of counting the clock periods comprised in a known $\Delta T$ is set by the test machine by means of the enable signal.

Through the output pads of the memory device the n-bits of the counter 30 are read and the detected frequency $F_{CLOCK} = 1/(N\ \Delta T)$ happens to be the clock target frequency; in the contrary case, action is taken on the configuration bits and the measuring is repeated. FIG. 2A schematically shows how this frequency is detected.

In case the right configuration is not found for obtaining the target frequency, the device is discarded.

In general, this way of proceeding shows different limits:

The process requires the intervention of an external test machine able to read and to make decisions on the correcting actions to be taken.

The corrections to be actuated are different from device to device, thus the test machine must question the single device and perform an ad hoc correction for it.

Consequently, the test machine is obliged to serialize the controls with subsequent decrease of productivity.

BRIEF SUMMARY

One embodiment is a method and a device for automatically regulating the reference sources in a non-volatile memory device, for example a flash memory, having such respective functional and structural characteristics as to limit the intervention of the test machine, increase the productivity in the adjustment step, and thus overcome the limits of the prior art solutions.

One embodiment carries out, in parallel on more memory devices, the regulation of all the reference sources contained in each flash memory device.

The circuit architecture proposed by one embodiment of the present invention allows limiting the intervention of the test machine without jeopardizing the test parallelism on more devices, with subsequent increase of the productivity.

The characteristics and the advantages of the method and of the device according to the invention will be apparent from the following description of an embodiment thereof given by way of indicative and non-limiting example with reference to the annexed drawings.

BRIEF DESCRIPTION OF THE SEVERAL VIEWS OF THE DRAWINGS

In these drawings:

FIG. 2 shows a schematic view illustrating the measuring modes and the regulation of a clock source according to the prior art;

FIG. 2A schematically shows how the frequency of the clock source of the example of FIG. 2 is detected;

DETAILED DESCRIPTION

Figure 1:
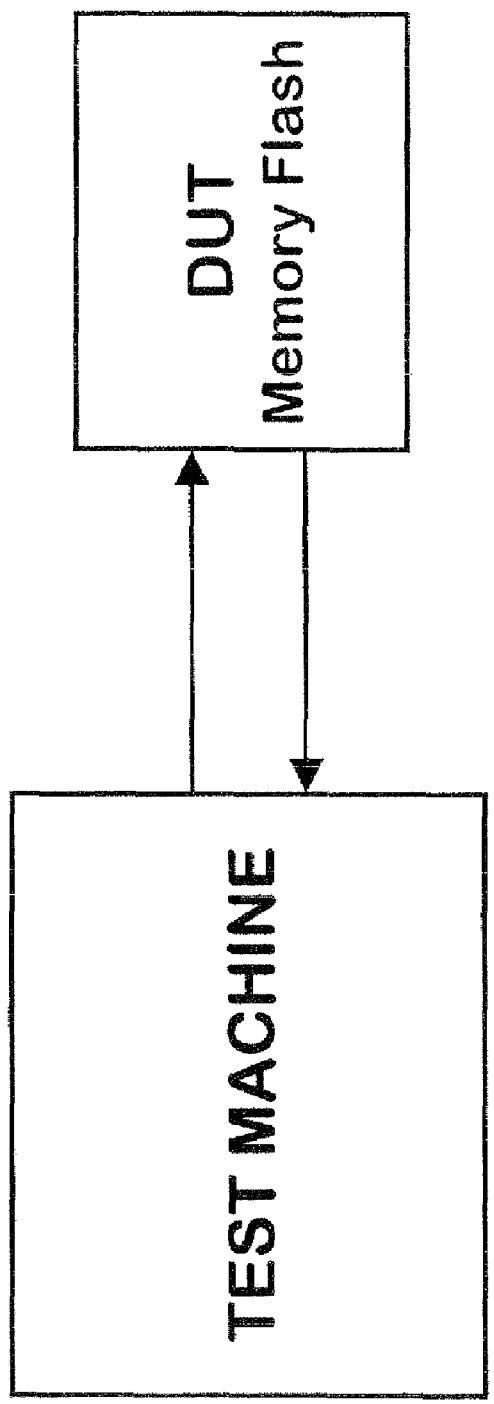
FIG. 1 shows a schematic view of a test machine coupled to a non-volatile memory device for carrying out an automatic regulation of current references.
Figure 3:
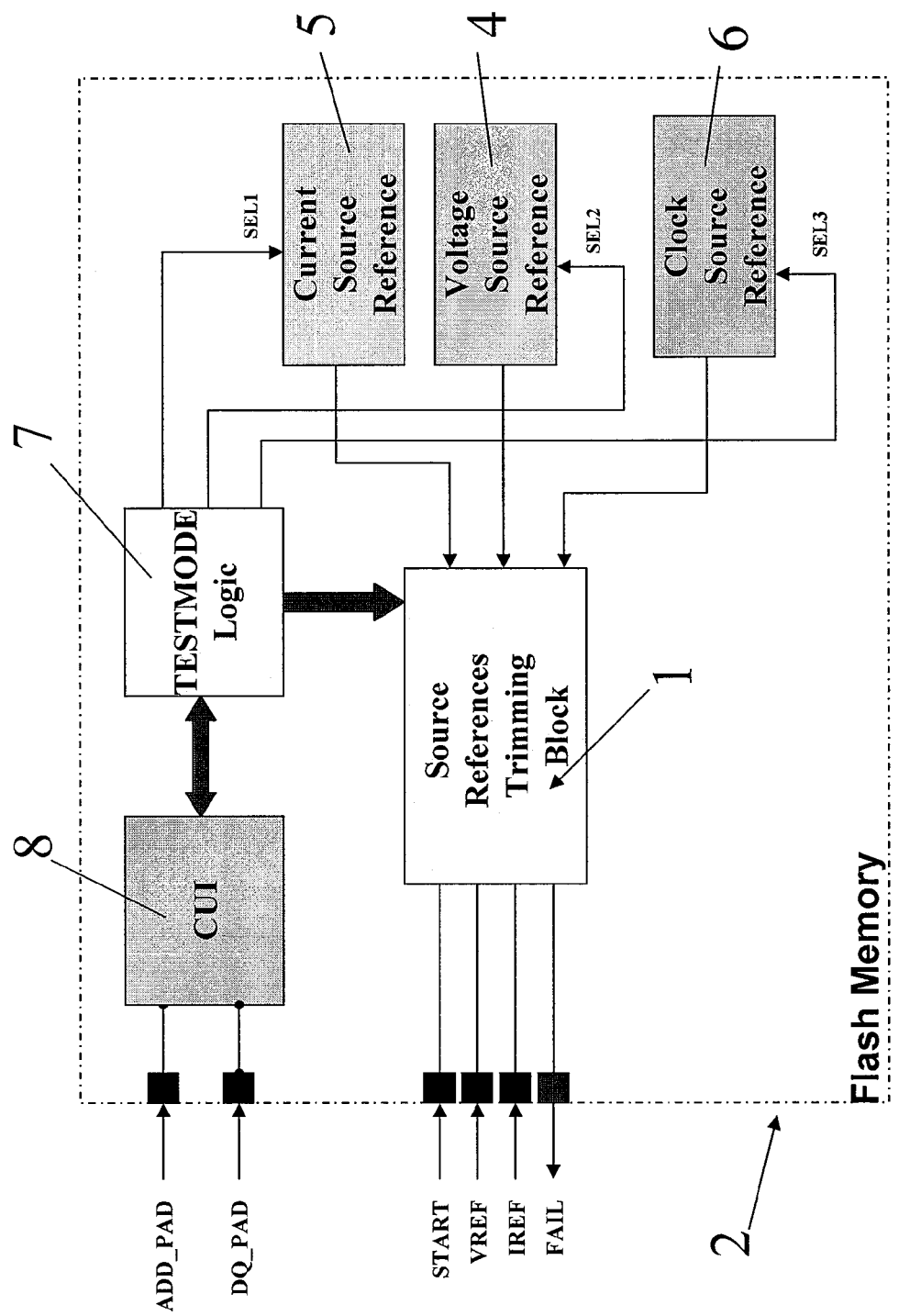
FIG. 3 shows a schematic view of the circuit architecture of an electronic memory device incorporating a regulation device of the voltage, current and frequency references.

With reference to these figures, and in particular to the example of FIG. 3, 1 globally indicates, through schematic blocks, an architecture of a regulation device of the reference sources inside an electronic memory device 2, for example a memory of the Flash EEPROM type.

In particular, in FIG. 3 three types of sources or generators to be regulated have been inserted, for example: a source in voltage 4, a source in current 5 and a source in frequency 6, this latter allowing a regulation of the clock signal. This must not be considered as limiting of the Applicant's rights since other embodiments may be easily adapted to a greater number of sources or of generators to be regulated.

Hereafter, for simplicity, reference will be made to the case of the three types of references. Let's first see the regulation of the sources, i.e., of the generators, in voltage 4 and in current 5.

In general, before testing the several functions and specifications inside a flash memory device 2, a regulation of the reference circuits for the voltages and for the currents is carried out.

The device 2 comprises a control unit 8 connected outside by means of pads ADD_PAD and DQ_PAD and connected inside to a testing logic 7 which supervises the activities of the testing operations.

Figure 4:
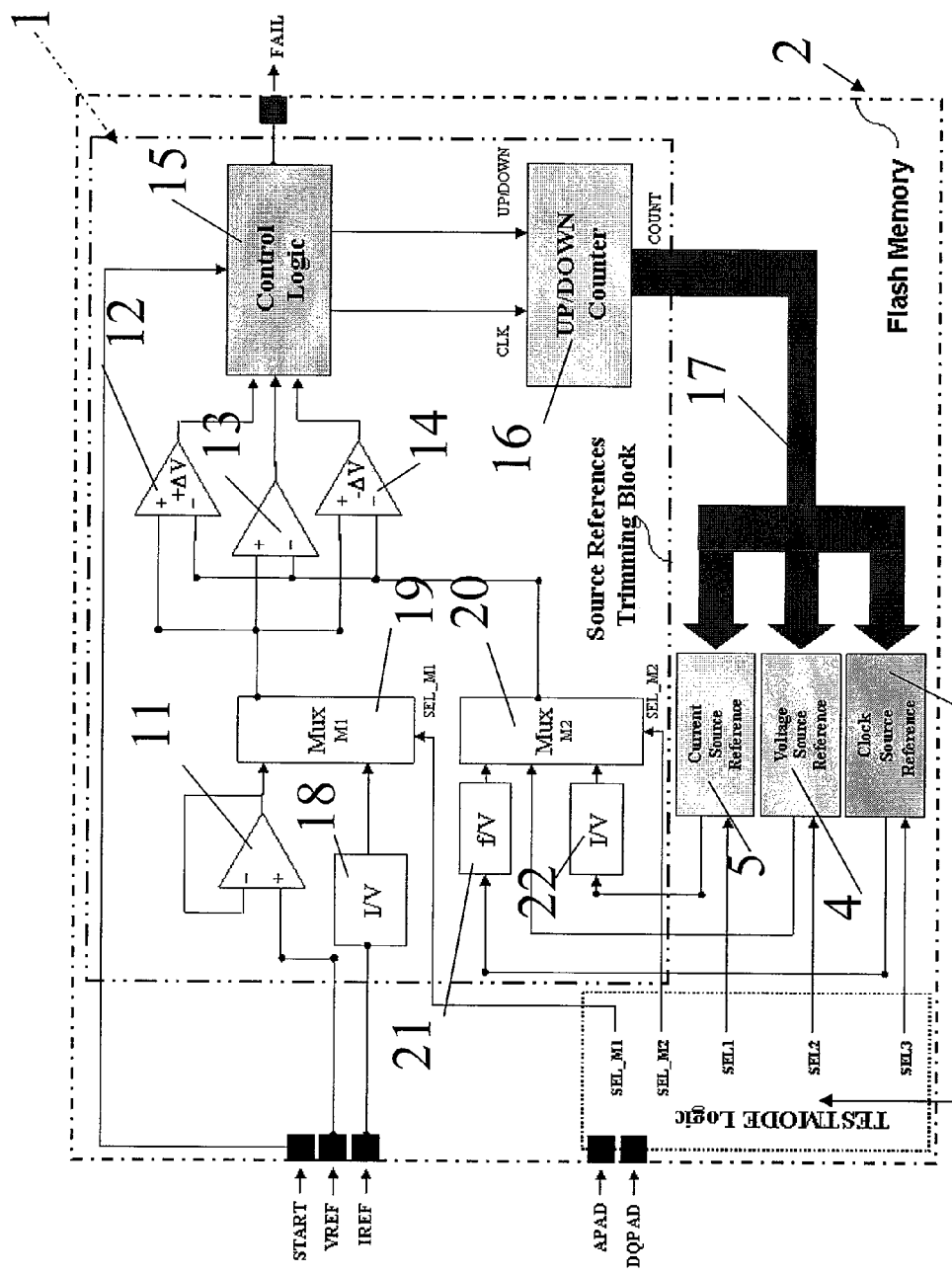
FIG. 4 shows a schematic view, in greater detail, of the architecture of FIG. 3.

Advantageously, according to one embodiment, the device 2 is provided with an inner regulation device 1 of some reference sources, in particular reference sources in voltage 4, in current 5 and in frequency 6. A test mode block 23, as shown in FIG. 4, is provided to manage the pads ADD_PAD and DQ_PAD that allow to select which one of said reference sources is to be put first under regulation.

The device 2 receives from the outside a START signal for enabling at the start of the testing procedure, as well as respective signals in voltage and current $V_{REF}$ and $I_{REF}$ which represent external voltage and current references.

The device 2 also emits an output logic signal FAIL for signaling the possible testing failure.

On the basis of the architecture here proposed, the regulation method according to one embodiment of the invention consists of the following steps:

1. providing commands for the input in TESTMODE (START);
2. providing a command for the selection of the reference source to be regulated;
3. applying the reference sample signal (resp. $I_{REF}$);
4. "low-high", "high-low" transition of the signal START with duration of some tens of milliseconds at the high logic level;
5. reading the logic level of the signal FAIL for verifying if the regulation has succeeded;
6. re-iteration of the previous steps 1-4 for all the transition and/or current references of the device;

Making now reference to FIG. 4, hereafter the regulation modes of a reference generator in voltage, indicated with 4 as in FIG. 2, and of a reference generator in current, indicated with 5, are described.

According to the architecture here proposed by way of indicative and non-limiting example, a signal START and a reference voltage $V_{REF}$ equal to the desired regulation value are to be supplied through a test machine not represented in the figures.

The reference voltage $V_{REF}$ biases, through a voltage buffer 11, the respective reference non-inverting inputs "+" of three comparators 12, 13, 14. Comparators 12, 13 are comparators with offset, in fact, comparator 12 shows a positive offset with respect to $V_{REF}$ and comparator 13 shows a negative offset with respect to $V_{REF}$, i.e., they respectively have a release threshold $V_{REF}+\Delta_{toll}/2$ and $V_{REF}-\Delta_{toll}/2$. The offset represents the limit to the precision with which the circuit to be regulated is configured, in this case the reference generator 4 or 5. For example, if the difference between two adjacent configurations of the Band gap generator is of 40 mV, the offset ($\Delta_{toll}/2$) may be comprised between 0 and 40 mV. The choice of the tolerance $\Delta_{toll}$ can be fixed or set from the outside through the test machine.

After having selected the reference generator 4 or 5 to be regulated (by using classic selection methods such as for example latch tests), the test machine enhances the signal START. On the rise edge of the signal START a control logic 15, connected to the respective outputs of the comparators 12, 13 and 14, enables the counter 16 ahead/behind (UP/DOWN) which, according to the result of the comparison between the width to be regulated and the threshold comparators 12, 13 and 14 "decides" whether to increase or decrease the counting of the counter 16 so as to reach a value of regulated width within the limits of the admitted tolerance $\Delta_{toll}$.

As per what has been previously described, it is guessed that in order for the system to operate correctly, the several configurations may give a monotonously increasing contribution to the regulation. For example, in the case of a voltage reference (Band gap) a regulation table of the configuration bits of the Band gap circuit has to be of the type reported hereafter:

| Configuration | Correction |
| --- | --- |
| 000 | −50 mV |
| 001 | −40 mV |
| 010 | −30 mV |
| 100 | 0 |
| ... | ... |
| 111 | +70 mV |

From this table it can be appreciated that the entity of the correction provided by each configuration is not so important as the fact that these may be ordered in an increasing way starting from the lowest value towards the highest one. In the above reported example it has been supposed that the block to be regulated had three sole configuration bits, in reality the number of bits can be arbitrarily big.

After a predetermined time interval (in general some tens of milliseconds) the test machine lowers the signal START. At this point, the control logic 15 outputs a signal FAIL indicating that the regulation has succeeded, i.e., that the regulated value is comprised within the limits of the admitted tolerance or, vice versa, if the logic value of FAIL is low, indicating that the tolerance has not been respected and the device 2 must be discarded.

After the regulation of the generator of the voltage reference 4, the regulation of another reference can be carried out, for example of the generator of the reference current 5, if present.

The operation is similar to that in case of the regulation of a voltage generator apart from that in this case the test machine supplies to memory with a reference current $I_{REF}$ identical to the design target one of the current generator 5.

In the device 1 a current/voltage I/V converter 18 is incorporated and connected downstream of the input terminal whereon the external reference signal in current $I_{REF}$ is applied. At the output of this converter 18 an analog multiplexer 19 is provided. A second analog multiplexer 20 in the device 1 receives the outputs of the reference generators in current 5 and in frequency 6 through respective current/voltage 21 and frequency/voltage 22 converters.

At the beginning, the control logic 15 makes all the analog multiplexers 19, 20 switch so as to carry out a voltage current conversion. In one embodiment, the operation of the entire regulation device 1 can be referred to in the case of voltage measurement and comparison.

It is important that the configuration of the current generator 5 and the corresponding output current are monotonously increasing. In the case of the current generator 5 the tolerance or error is given by the conversion in current of the offset voltage of the comparator 13.

Figure 5:
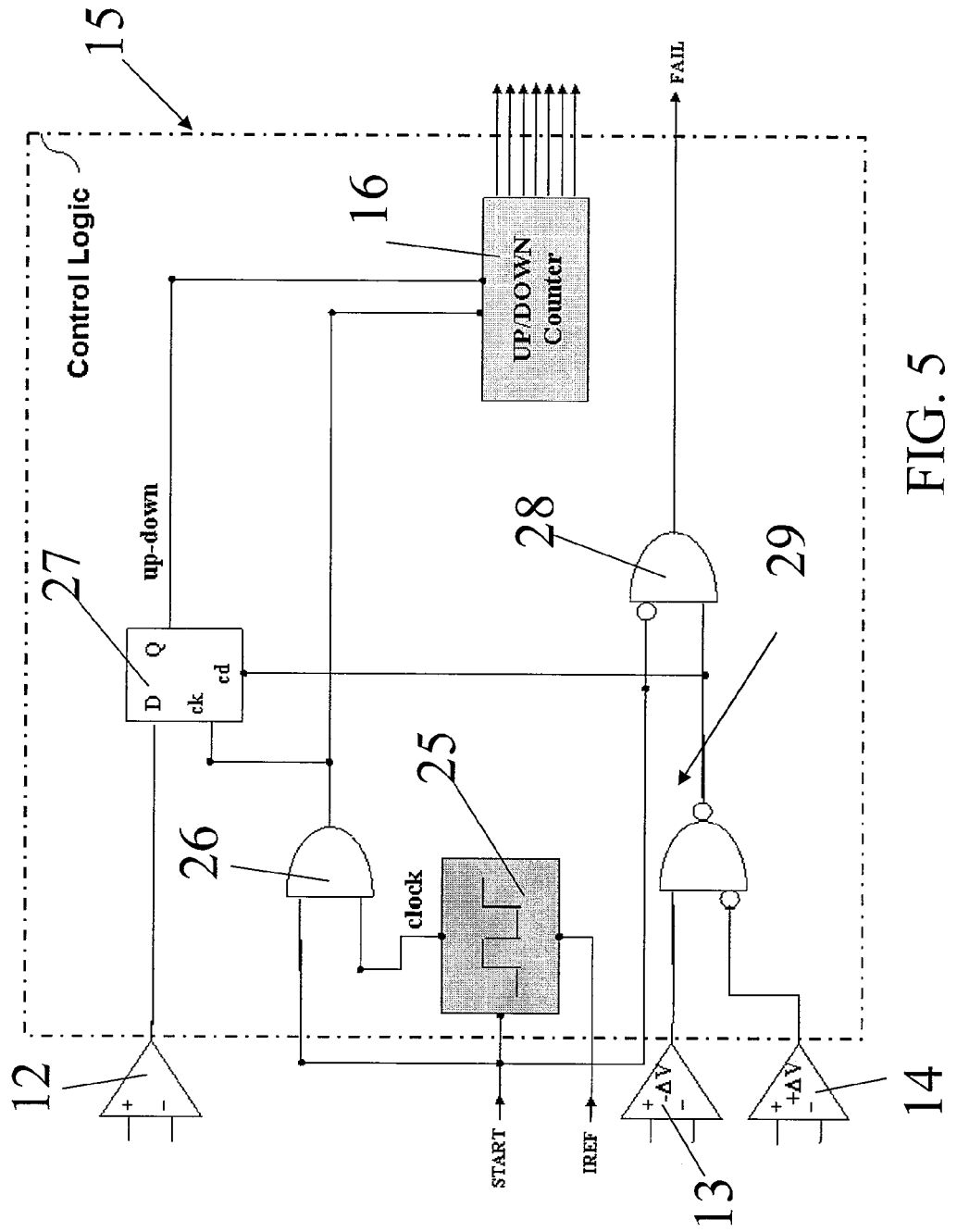
FIG. 5 shows a schematic view of a detail of the architecture of FIG. 4.

A regulation mode of the reference generator in frequency 6 will now be described. According to one embodiment, this regulation consists of the following steps:

1. Commands for the input in TESTMODE
2. Command for the selection of the generator to be regulated
3. Application of the reference signals $V_{REF}$ and $I_{REF}$
4. "low-high", "high-low" transition of the signal START with duration of some tens of milliseconds at high logic level
5. Control of the logic level of the signal FAIL for verifying if the regulation has succeeded
6. Re-iteration of the steps 1-4 for all the clock signal references in the device FIG. 5 reports one embodiment of how to implement the block relative to the control logic 15 in the proposed architecture.

This control logic 15 comprises a generator block 25 of a clock signal, whereto the signal START is applied, and a logic network 29. The counter 16 UP/DOWN is indicated in this FIG. 5 as being part of the control logic 15. The counter 16 in fact receives the signal outputting from the clock generator block 25 through a logic gate 26.

The clock signal is applied also to a flip-flop cell 27, of the DT type, which receives on its own input the signal outputting from the comparator 12 and on another input the signal outputting of the counter 16 for outputting a logic signal which, through a logic gate 28 being part of a logic network 29, is transmitted to the output of the control logic 15 as signal FAIL. The logic network 29 receives the signals outputting from the counters 13 and 14.

The operation can be thus summarized: the signal produced by the inner clock block 25 is transformed into voltage through the frequency/voltage f/V converter 21. This voltage is applied to the regulation loop through the second multiplexer 20 shown in FIG. 4.

The counter 16 takes care of finding the correct configuration which turns out when the difference between the reference voltage and the one made by the clock is lower than $\Delta_{toll}$. As in the previous cases the counter 16 is driven by the control logic 15.

The frequency/voltage counter 21 can be implemented by exploiting, for example, the charge of a capacitor with a constant current during some tens of clock periods or by using one of the several solutions present in the literature.

It is worth noting that also for the configuration of the clock generator block 25 the corrections for the several configurations may be monotonously increasing.

Starting from a reference current $I_{REF}$, inside the memory device 2 (previously already regulated), a clock signal can be constructed (for example as charge/discharge of a capacitor through a constant current) that will serve as a time base for the various circuits present in the proposed architecture. It is however to be noted that the accuracy of this clock may not need to be very high, neither in terms of precision nor in terms of frequency. The frequency value may be chosen so that in a clock period the measure circuitry inside the device 2 completes its job correctly.

Thus, according to one embodiment, the time $\Delta T$ set by the test machine for completing the measuring ($\Delta T$=duration of the start signal at "high" logic value) may need to be equal at least to $N \cdot T_{clock}$ (with N=number of possible configurations for a given reference).

One embodiment of the invention makes use of generic macro blocks (MUX, comparators etc . . . ). It is possible to implement the blocks in any way and in any technology. It is also possible, if this facilitates the realization of the device, to operate in current rather than in voltage, i.e.: the comparators with offset in current can be substituted for comparators with offset in voltage.

Obviously, in this case it may be desirable to substitute the V/I converters for I/V converters. This hypothesis can be clearly worked out by a technician of the field as dual solution with respect to the one proposed. However, a variation of architecture of this type does not add particular improvements, the sole advantage it could bring would be that of re-using already tested blocks on the particular technology used.

It is also possible to eliminate the V/I or I/V converters by simultaneously introducing in the architecture both types of comparators. In so doing, one may choose not to provide the multiplexers 18 and 20. This type of implementation is however expensive in terms of area occupation on the silicon.

The method described can be usefully employed both for the correction of primary sources as (BAND GAP) and for realizing generators of reference currents (CURRGEN), as well as for the correction of sources of secondary signals as regulators of charge pumps and, in general, devices whose width to be regulated is a voltage or a current or any width that can be referred to them.

The architecture of one embodiment of the invention allows a parallel use on more devices simultaneously also in the cases in which the parallelism is to be maximized by using solutions of the LPC type (Low Pin Count) since it requires few external signals for the actuation of the test; these signals are already widely provided for testing other functions of a FLASH memory.

With the classic regulation methods of the sources, the regulation of a reference requires 250 ms, considering that on a semiconductor silicon wafer a thousand flash memories to be tested can be realized, this implies a use of time equal to 250 seconds. By using the proposed architecture of one embodiment and taking into account, for example, a test parallelism of 144 devices, a test time equal to about 1.8 seconds would be obtained.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
providing in a non-volatile memory device a plurality of reference sources for the memory device;
receiving an external current reference signal;
receiving an internal current reference signal;
converting said current reference signals to voltages;
comparing said voltages;
based on said comparison, controlling the output of a counter; and
using said counter output to adjust the internal current reference signal.

2. The method according to claim 1 further comprising correcting the reference sources, wherein correcting the reference sources occurs in the regulation device with monotonously increasing correction steps.

3. A non-volatile electronic memory device comprising:
a plurality of reference sources; and
a regulation device that includes:
a converter to convert an internal current reference and an external reference to voltages;
a comparator to compare said voltages;
a control logic receiving output signals from said comparator; and
a counter connected to an output of said control logic to adjust the interior reference signal based on said comparator output.

4. The electronic memory device according to claim 3 wherein said reference sources include a reference voltage source, a reference current source, and a reference frequency source.

* * * * *